(12) United States Patent
Chen

(10) Patent No.: US 11,121,678 B1
(45) Date of Patent: Sep. 14, 2021

(54) VACUUM TUBE AMPLIFICATION SYSTEM CAPABLE OF REDUCING RESIDUAL NOISE AND A GROUNDING METHOD THEREOF

(71) Applicant: ECHOWELL ELECTRONIC CO., LTD., New Taipei (TW)

(72) Inventor: Hsi-Hsien Chen, New Taipei (TW)

(73) Assignee: ECHOWELL ELECTRONIC CO., LTD, New Taipei (TW)

( * ) Notice: Subject to any disclaimer, the term of this patent is extended or adjusted under 35 U.S.C. 154(b) by 0 days.

(21) Appl. No.: 16/892,403

(22) Filed: Jun. 4, 2020

(51) Int. Cl.
| | |
|---|---|
| *H03F 3/60* | (2006.01) |
| *H03F 1/28* | (2006.01) |
| *H03F 1/16* | (2006.01) |
| *H03F 3/02* | (2006.01) |
| *H03F 1/20* | (2006.01) |

(52) U.S. Cl.
CPC .............. *H03F 1/28* (2013.01); *H03F 1/16* (2013.01); *H03F 3/02* (2013.01); *H03F 1/20* (2013.01); *H03F 2200/372* (2013.01)

(58) Field of Classification Search
CPC ..... H03F 1/28; H03F 3/02; H03F 1/16; H03F 1/08; H03F 1/54; H03F 2200/372; H03F 2200/549; H01J 21/065; H01J 25/00; H01J 25/54
See application file for complete search history.

(56) References Cited

U.S. PATENT DOCUMENTS 9,467,110 B1 * 10/2016 Nawrocki ............. H03F 1/0205
10,135,402 B1 * 11/2018 Chen ........................ H03F 1/30

* cited by examiner

*Primary Examiner* — Khanh V Nguyen
(74) *Attorney, Agent, or Firm* — Locke Lord LLP; Tim Tingkang Xia, Esq.

(57) ABSTRACT

A vacuum tube amplification system includes: a first power circuit electrically connected to utility power alternating voltage to transform it into a first DC voltage; a first vacuum tube amplification load circuit having a first grounding end, the first vacuum tube amplification load circuit using the first DC voltage as operating voltage; a second power circuit electrically connected to the utility power alternating voltage to transform it into a second DC voltage and output the second DC voltage; and a second vacuum tube amplification load circuit having a second grounding end, the second vacuum tube amplification load circuit using the second DC voltage as operating voltage. The first grounding end is not directly electrically connected to the second grounding end, the first grounding end and the second grounding end are each electrically connected to a compliance ground of the utility power alternating voltage through a jumper-wire zero-ohm resistor.

16 Claims, 14 Drawing Sheets

VACUUM TUBE AMPLIFICATION SYSTEM CAPABLE OF REDUCING RESIDUAL NOISE AND A GROUNDING METHOD THEREOF

BACKGROUND OF THE INVENTION

Field of the Invention

The present disclosure relates to vacuum tube amplification systems and grounding methods for the same and, more particularly, to a vacuum tube amplification system capable of reducing residual noise and a grounding method thereof.

Description of the Prior Art

Compared with transistors, vacuum tubes produce better medium-frequency and high-frequency tones. However, vacuum tubes are generally used in high-end Hi-Fi systems only, because conventional grounding methods lead to excessive residual noise. Application of vacuum tubes to desktop radios or desktop mini Hi-Fi fails to meet modern requirement for short-distance listening. It is possible to stabilize voltage and thus reduce residual noise with a large number of transistors, albeit to the detriment of cost-effectiveness and good tones otherwise typical of vacuum tubes. Therefore, it is imperative to provide a vacuum tube amplification system capable of keeping good tones typical of vacuum tubes and reducing residual noise and a grounding method for the same.

SUMMARY OF THE INVENTION

In view of the aforesaid drawbacks of the prior art, it is an objective of the present disclosure to provide a vacuum tube amplification system capable of keeping good tones typical of vacuum tubes and reducing residual noise and a grounding method for the same.

To achieve at least the above objective, the present disclosure provides a vacuum tube amplification system, comprising: a first power circuit electrically connected to a utility power alternating voltage to transform the utility power alternating voltage into a first DC voltage and output the first DC voltage; a first vacuum tube amplification load circuit having a first input signal end and a first grounding end, the first vacuum tube amplification load circuit comprising a first vacuum tube amplification circuit, and using the first DC voltage as operating voltage; a second power circuit electrically connected to the utility power alternating voltage to transform the utility power alternating voltage into a second DC voltage and output the second DC voltage; and a second vacuum tube amplification load circuit having a second input signal end and a second grounding end, the second vacuum tube amplification load circuit comprising a second vacuum tube amplification circuit, and using the second DC voltage as operating voltage; wherein the first grounding end of the first vacuum tube amplification load circuit is not directly electrically connected to the second grounding end of the second vacuum tube amplification load circuit, wherein the first grounding end and the second grounding end are each electrically connected to a compliance ground of the utility power alternating voltage through a jumper-wire zero-ohm resistor.

In a preferred embodiment of the present disclosure, the first input signal end electrically receives a first audio input signal, and the second input signal end electrically receives a second audio input signal.

In a preferred embodiment of the present disclosure, the first audio input signal is a left-channel audio signal, and the second audio input signal is a right-channel audio signal.

In a preferred embodiment of the present disclosure, the first power circuit comprises: a first power transformer having an exciting coil, a high voltage induction coil and a low voltage induction coil; a high voltage DC power circuit electrically connected to the high voltage induction coil to rectify and output a DC high voltage; and a low voltage DC power circuit electrically connected to the low voltage induction coil to rectify and output a DC low voltage, wherein the exciting coil of the first power transformer is electrically connected to the utility power alternating voltage, whereas the high voltage DC power circuit and the low voltage DC power circuit are electrically connected to the first grounding end of the first vacuum tube amplification load circuit, wherein the first DC voltage comprises the DC low voltage (vacuum tube filament voltage in a specific embodiment) and the DC high voltage.

In a preferred embodiment of the present disclosure, the second power circuit comprises: a second power transformer having an exciting coil, a high voltage induction coil and a low voltage induction coil; a high voltage DC power circuit electrically connected to the high voltage induction coil to rectify and output a DC high voltage; and a low voltage DC power circuit electrically connected to the low voltage induction coil to rectify and output a DC low voltage, wherein the exciting coil of the second power transformer is electrically connected to the utility power alternating voltage, whereas the high voltage DC power circuit and the low voltage DC power circuit are electrically connected to the second grounding end of the second vacuum tube amplification load circuit, wherein the second DC voltage comprises the DC low voltage (vacuum tube filament voltage in a specific embodiment) and the DC high voltage.

To achieve at least the above objective, the present disclosure further provides a grounding method for a vacuum tube amplification system, the vacuum tube amplification system comprising a first power circuit, a first vacuum tube amplification load circuit, a second power circuit and a second vacuum tube amplification load circuit, wherein the first power circuit supplies power to the first vacuum tube amplification load circuit for operation thereof, and the second power circuit supplies power to the second vacuum tube amplification load circuit for operation thereof, the grounding method comprising the steps of: electrically connecting the first power circuit and the second power circuit separately to a utility power alternating voltage; electrically connecting the first power circuit and the first vacuum tube amplification load circuit jointly to a first grounding end; electrically connecting the second power circuit and the second vacuum tube amplification load circuit jointly to a second grounding end; and electrically connecting the first grounding end and the second grounding end separately to a compliance ground of the utility power alternating voltage through a jumper-wire zero-ohm resistor, without electrically connecting the first grounding end directly to the second grounding end.

In a preferred embodiment of the present disclosure, the first power circuit comprises: a first power transformer having an exciting coil, a high voltage induction coil and a low voltage induction coil; a high voltage DC power circuit electrically connected to the high voltage induction coil to rectify and output a DC high voltage; and a low voltage DC power circuit electrically connected to the low voltage induction coil to rectify and output a DC low voltage, wherein the exciting coil of the first power transformer is electrically connected to the utility power alternating voltage, whereas the high voltage DC power circuit and the low voltage DC power circuit are electrically connected to the first grounding end, wherein the DC low voltage and the DC high voltage are supplied to the first vacuum tube amplification load circuit.

In a preferred embodiment of the present disclosure, the second power circuit comprises: a second power transformer having an exciting coil, a high voltage induction coil and a low voltage induction coil; a high voltage DC power circuit electrically connected to the high voltage induction coil to rectify and output a DC high voltage; and a low voltage DC power circuit electrically connected to the low voltage induction coil to rectify and output a DC low voltage, wherein the exciting coil of the second power transformer is electrically connected to the utility power alternating voltage, whereas the high voltage DC power circuit and the low voltage DC power circuit are electrically connected to the second grounding end, wherein the DC low voltage and the DC high voltage are supplied to the second vacuum tube amplification load circuit.

To achieve at least the above objective, the present disclosure further provides a vacuum tube amplification system, comprising: a first vacuum tube amplification load circuit having a first input signal end, a first output signal end and a first grounding end, the first input signal end electrically receiving a first audio input signal; a first DC power circuit for outputting a first DC voltage to be supplied to the first vacuum tube amplification load circuit for operation thereof; a second vacuum tube amplification load circuit having a second input signal end, a second output signal end and a second grounding end, the second input signal end electrically receiving a second audio input signal; a second DC power circuit for outputting a second DC voltage to be supplied to the second vacuum tube amplification load circuit for operation thereof; and a power transformer having an exciting coil, a first induction coil and a second induction coil, the exciting coil receiving a utility power alternating voltage, the first induction coil providing a first utility alternating power to the first DC power circuit, and the second induction coil providing a second utility alternating power to the second DC power circuit, wherein the first grounding end is not directly electrically connected to the second grounding end, whereas the first grounding end and the second grounding end are each electrically connected to a compliance ground of the utility power alternating voltage through a jumper-wire zero-ohm resistor.

In a preferred embodiment of the present disclosure, the first DC power circuit and the second DC power circuit are electrically connected to the first grounding end and the second grounding end, respectively.

In a preferred embodiment of the present disclosure, the first DC voltage comprises a DC high voltage and a DC low voltage, whereas the first vacuum tube amplification load circuit comprises a plurality of vacuum tubes, wherein the DC high voltage and the DC low voltage are supplied to the vacuum tubes for operation thereof.

In a preferred embodiment of the present disclosure, the second DC voltage comprises a DC high voltage and a DC low voltage, whereas the second vacuum tube amplification load circuit comprises a plurality of vacuum tubes, wherein the DC high voltage and the DC low voltage are supplied to the vacuum tubes for operation thereof.

In a preferred embodiment of the present disclosure, the first induction coil and the second induction coil have the same winding configuration.

In a preferred embodiment of the present disclosure, the first induction coil has a first high voltage winding and a first low voltage winding, whereas the second induction coil has a second high voltage winding and a second low voltage winding, wherein the first high voltage winding and the second high voltage winding have the same winding configuration, whereas the first low voltage winding and the second low voltage winding have the same winding configuration.

To achieve at least the above objective, the present disclosure further provides a grounding method for a vacuum tube amplification system, the vacuum tube amplification system comprising a first DC power circuit, a first vacuum tube amplification load circuit, a second DC power circuit and a second vacuum tube amplification load circuit, wherein the first DC power circuit supplies power to the first vacuum tube amplification load circuit for operation thereof, and the second DC power circuit supplies power to the second vacuum tube amplification load circuit for operation thereof, the grounding method comprising the steps of: receiving a utility power alternating voltage by a first exciting coil of a power transformer; electrically connecting a first induction coil and a second induction coil of the power transformer to the first DC power circuit and the second DC power circuit, respectively; electrically connecting the first DC power circuit and the first vacuum tube amplification load circuit to a first grounding end from inside to outside step by step (in a specific embodiment, the concept "electrically connecting . . . to . . . from inside to outside step by step" means that the first vacuum tube amplification load circuit is electrically connected from inside to outside step by step, for example, electrically connecting the first vacuum tube first stage amplification circuit, first vacuum tube second stage amplification circuit, first vacuum tube power amplification circuit and first DC power circuit one by one); electrically connecting the second DC power circuit and the second vacuum tube amplification load circuit to a second grounding end from inside to outside step by step (in a specific embodiment, the concept "electrically connecting . . . to . . . from inside to outside step by step" means that the second vacuum tube amplification load circuit is electrically connected from inside to outside step by step, for example, electrically connecting the second vacuum tube first stage amplification circuit, second vacuum tube second stage amplification circuit, second vacuum tube power amplification circuit and second DC power circuit one by one); and electrically connecting the first grounding end and the second grounding end separately to a compliance ground of the utility power alternating voltage through a jumper-wire zero-ohm resistor, without electrically connecting the first grounding end directly to the second grounding end.

In a preferred embodiment of the present disclosure, the first induction coil and the second induction coil have the same winding configuration.

The aforesaid aspects and other aspects of the present disclosure are described in detail in accordance with the non-restrictive specific embodiments below and accompanying drawings.

DETAILED DESCRIPTION OF THE EMBODIMENTS

Figure 1:
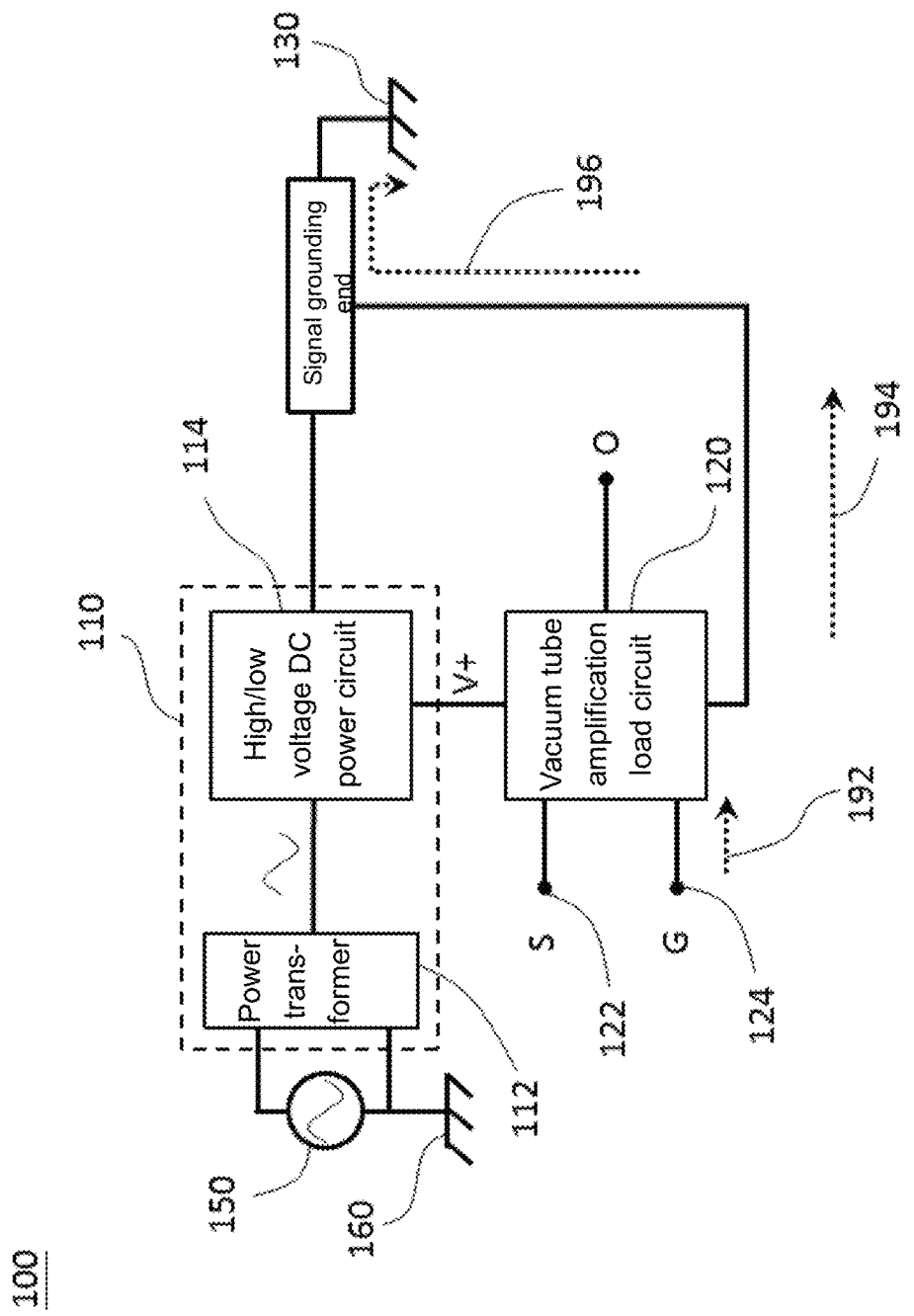
FIG. 1 is a block diagram of a vacuum tube amplification system according to a specific embodiment of the present disclosure.

Referring to FIG. 1, there is shown a block diagram of a vacuum tube amplification system according to a specific embodiment of the present disclosure. In the embodiment illustrated by FIG. 1, a vacuum tube amplification system 100 comprises a power circuit 110 and a vacuum tube amplification load circuit 120. The power circuit 110 is electrically connected to a utility power alternating voltage 150 to transform it into a DC voltage and output the DC voltage. The vacuum tube amplification load circuit 120 has an input signal end 122 and a grounding end 124. The input signal end 122 electrically receives audio input signals. In a specific embodiment, the vacuum tube amplification load circuit 120 comprises a vacuum tube preamplification circuit and a power amplification circuit, and uses DC voltage output by the power circuit 110 as operating voltage. In a specific embodiment, the grounding end 124 is connected, from inside to outside step by step (in a specific embodiment, the concept "connected, from inside to outside step by step" means that the vacuum tube amplification load circuit is connected from inside to outside step by step), to a compliance ground 130 through the vacuum tube amplification load circuit. In a specific embodiment, the compliance ground 130 is electrically connected to a compliance ground 160 of the utility alternating power of utility power alternating voltage 150. FIG. 1 shows signal ground wire running directions 192, 194, 196 in this embodiment. The signal ground wires do not form a closed loop, and thus residual noise level is extremely low.

In a specific embodiment, the power circuit 110 comprises a power transformer 112 and a high/low voltage DC power circuit 114. The high/low voltage DC power circuit 114 comprises a high voltage DC power circuit and a low voltage DC power circuit. The high voltage DC power circuit and low voltage DC power circuit are electrically connected to the grounding end 124 of the vacuum tube amplification load circuit 120. The power transformer 112 has an exciting coil, a high voltage induction coil and a low voltage induction coil. The exciting coil of the power transformer 112 is electrically connected to the utility power alternating voltage 150. The high voltage DC power circuit is electrically connected to the high voltage induction coil of the power transformer 112 to rectify and output a DC high voltage for use as vacuum tube operating voltage. The low voltage DC power circuit is electrically connected to the low voltage induction coil of the power transformer 112 to rectify and output a DC low voltage for use as vacuum tube filament voltage. The DC voltage which is transformed and output by the power circuit 110 comprises the DC low voltage and the DC high voltage.

Figure 2:
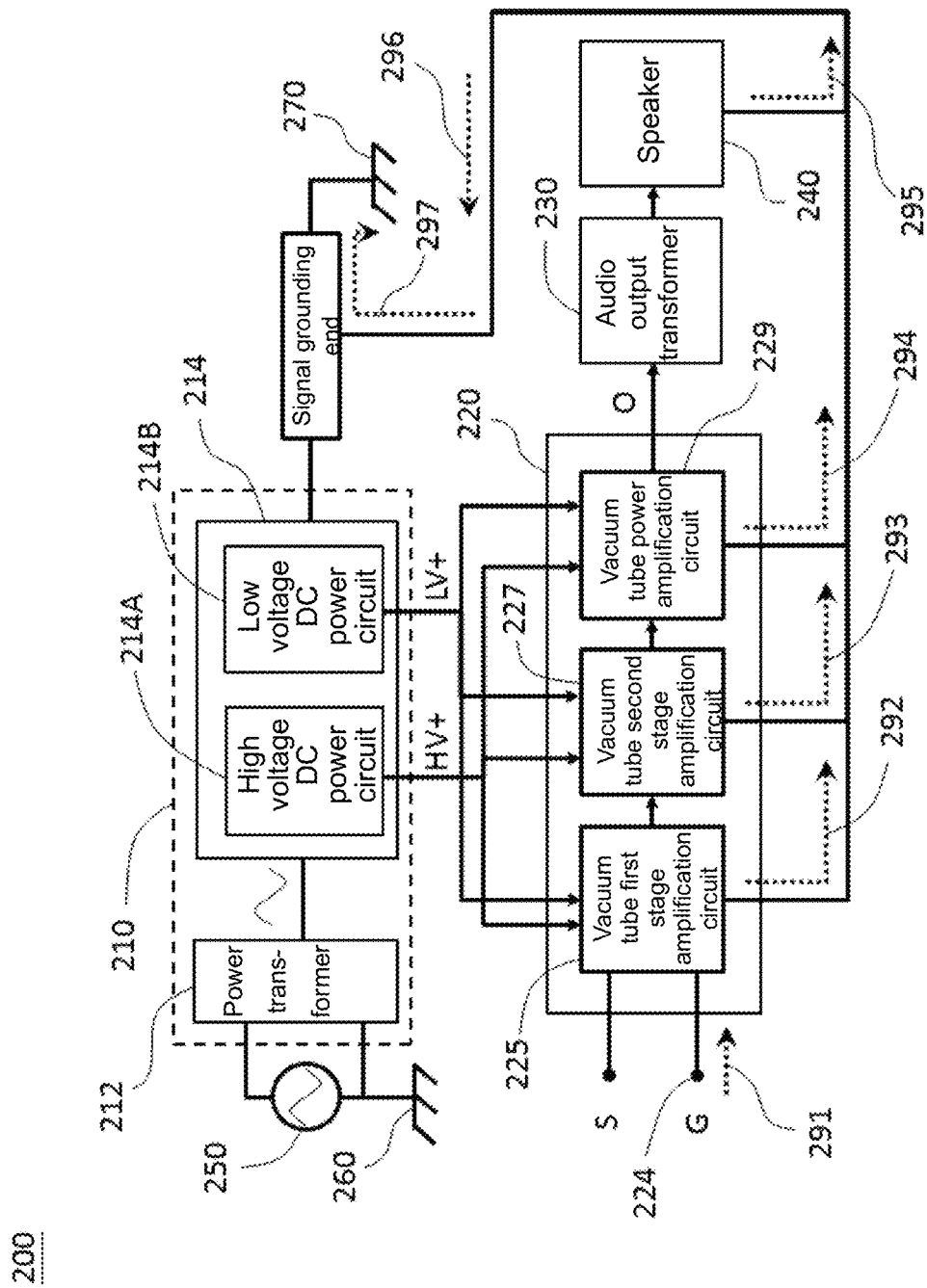
FIG. 2 is a detailed block diagram of the vacuum tube amplification system according to a specific embodiment of the present disclosure.

Referring to FIG. 2, there is shown a detailed block diagram of the vacuum tube amplification system according to a specific embodiment of the present disclosure. In the embodiment illustrated by FIG. 2, a vacuum tube amplification system 200 comprises a power circuit 210, a vacuum tube amplification load circuit 220, an audio output transformer 230 and a speaker 240. The power circuit 210 comprises a power transformer 212 and a high/low voltage DC power circuit 214. The high/low voltage DC power circuit 214 comprises a high voltage DC power circuit 214A and a low voltage DC power circuit 214B. The power transformer 212 has an exciting coil, a high voltage induction coil and a low voltage induction coil. The exciting coil of the power transformer 212 is electrically connected to a utility power alternating voltage 250. The high voltage DC power circuit 214A is electrically connected to the high voltage induction coil of the power transformer 212 to rectify and output a DC high voltage. The low voltage DC power circuit 214B is electrically connected to the low voltage induction coil of the power transformer 212 to rectify and output a DC low voltage. The vacuum tube amplification load circuit 220 comprises a vacuum tube first stage amplification circuit 225, a vacuum tube second stage amplification circuit 227 and a vacuum tube power amplification circuit 229. The vacuum tube first stage amplification circuit 225, vacuum tube second stage amplification circuit 227 and vacuum tube power amplification circuit 229 use the DC high voltage output by the high voltage DC power circuit 214A and the DC low voltage output by the low voltage DC power circuit 214B as operating voltage. The vacuum tube power amplification circuit 229 provides a power-amplified signal to the audio output transformer 230. Then, the audio output transformer 230 provides the processed signal to the speaker 240. Finally, the speaker 240 plays the processed audio signal.

FIG. 2 shows signal ground wire running directions 291, 292, 293, 294, 295, 296, 297 in this embodiment. The signal ground wires do not form a closed loop, and thus residual noise level is extremely low. In a specific embodiment, the grounding end 224 is electrically connected to the compliance ground 270 through a jumper-wire zero-ohm resistor. In a specific embodiment, the compliance ground 270 is electrically connected to the compliance ground 260 of the utility power alternating voltage 250. In a specific embodiment, the high voltage DC power circuit 214A and low voltage DC power circuit 214B are electrically connected to the grounding end 224 of the vacuum tube amplification load circuit 220.

Figure 3A:
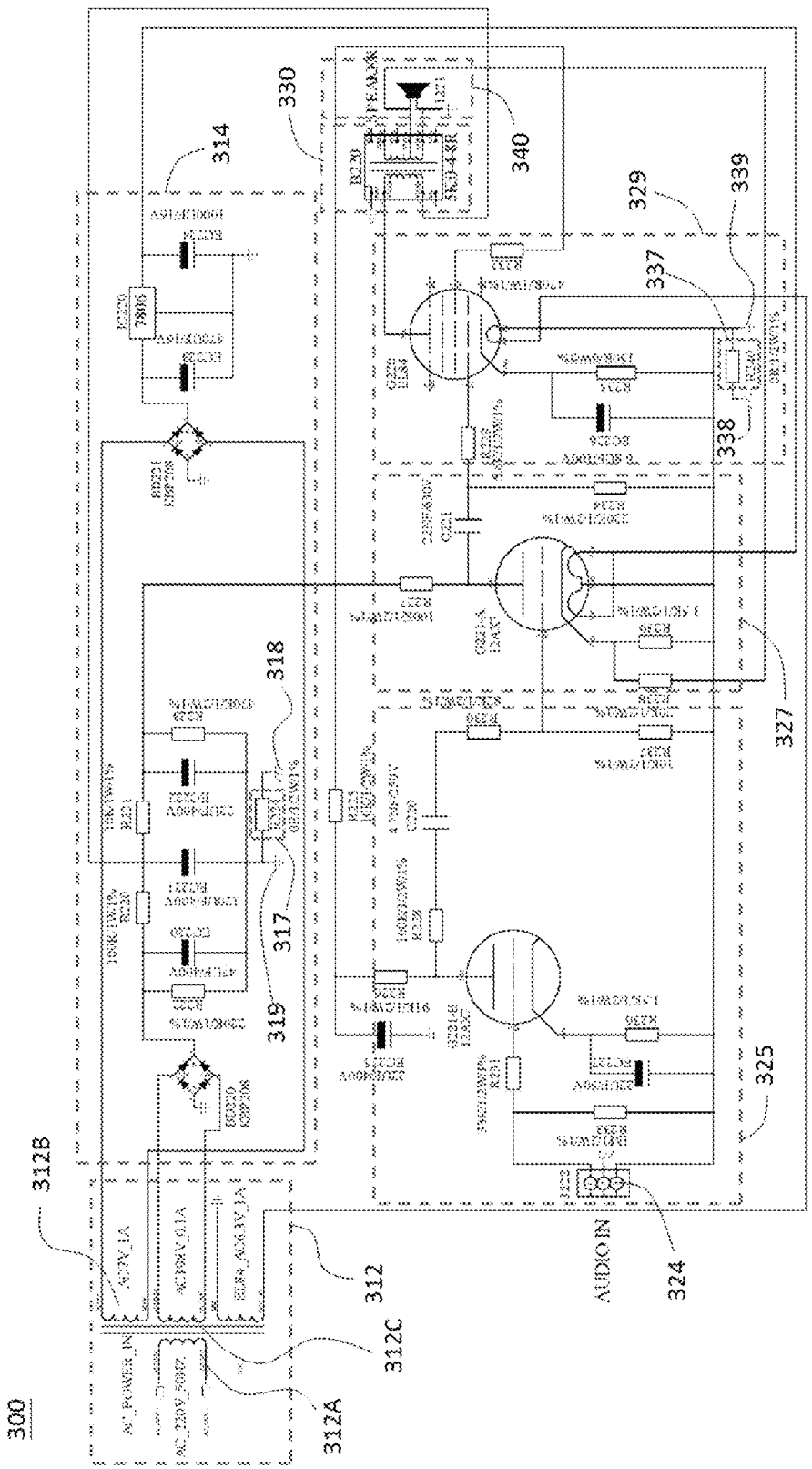
FIG. 3A is a mono schematic diagram (circuit diagram) of a circuit embodiment of the vacuum tube amplification system of FIG. 2.

Referring to FIG. 3A, there is shown a mono schematic diagram (circuit diagram) of a circuit embodiment of the vacuum tube amplification system of FIG. 2. In the embodiment illustrated by FIG. 3A, a vacuum tube amplification system 300 comprises a power transformer 312, a high/low voltage DC power circuit 314, a vacuum tube first stage amplification circuit 325, a vacuum tube second stage amplification circuit 327, a vacuum tube power amplification circuit 329, an audio output transformer 330 and a speaker 340. The power transformer 312 has an exciting coil 312A, a low voltage induction coil 312B and a high voltage induction coil 312C. The vacuum tube first stage amplification circuit 325 and vacuum tube second stage amplification circuit 327 use three-terminal vacuum tubes, whereas the vacuum tube power amplification circuit 329 uses five-terminal vacuum tubes. A grounding end 324 is electrically connected to a signal ground 339. The grounding end 324 is electrically connected to a compliance ground 338 through a jumper-wire zero-ohm resistor 337. The grounding end of the high/low voltage DC power circuit 314 is electrically connected to a signal ground 319. The grounding end of the high/low voltage DC power circuit 314 is electrically connected to a compliance ground 318 through a jumper-wire zero-ohm resistor 317. In a specific embodiment, the compliance ground 318 is electrically connected to the compliance ground 338.

Figure 3B:
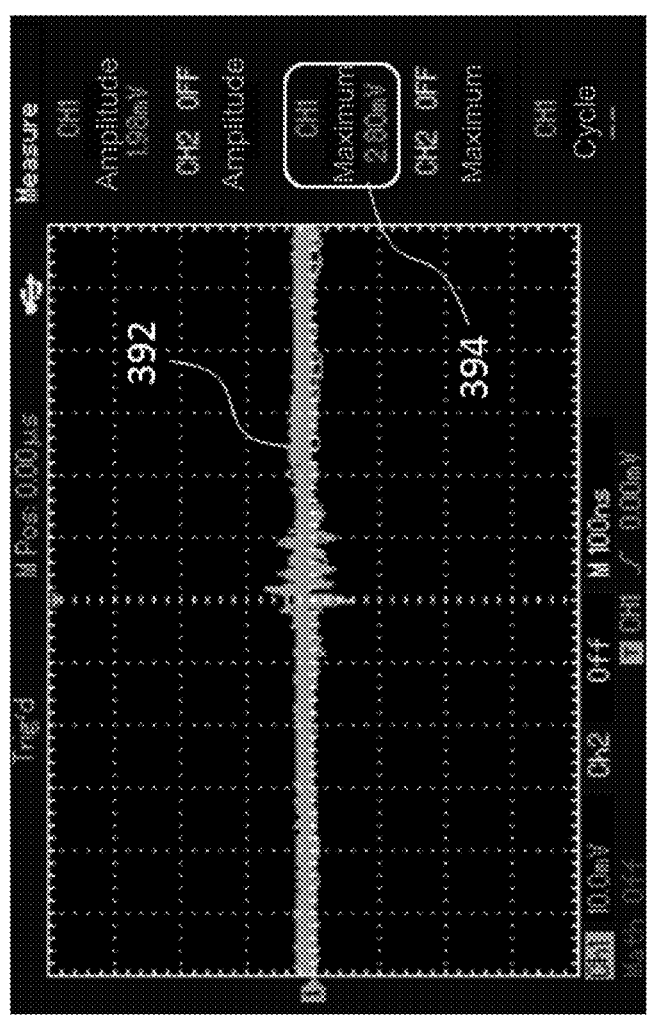
FIG. 3B shows results of a residual noise test conducted on the vacuum tube power amplification system with the circuit of FIG. 3A.

FIG. 3B shows results of a residual noise test conducted on the vacuum tube power amplification system with the circuit of FIG. 3A. The signal 392 shown in FIG. 3B indicates that the maximum residual noise level 394 of the vacuum tube is 2.8 mv/1.414=1.98 mv RMS and approximates to performance of transistors without a "hum" sound wave form or pulse noise interference.

Figure 4A:
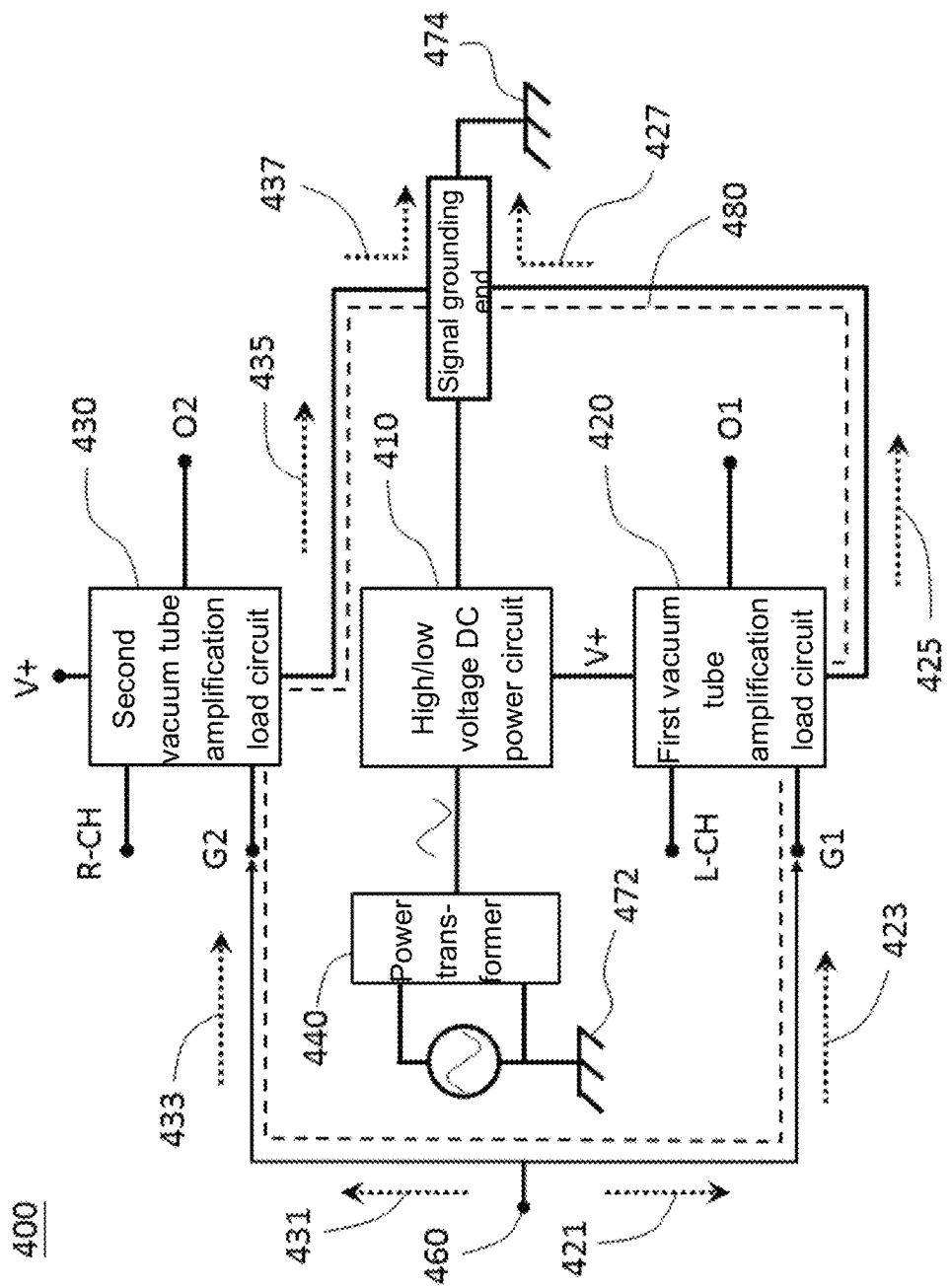
FIG. 4A (PRIOR ART) is a block diagram of a conventional vacuum tube amplification system according to a specific embodiment.

Referring to FIG. 4A, there is shown a block diagram of a conventional vacuum tube amplification system (with a right channel and a left channel) according to a specific embodiment. As shown in FIG. 4A, a conventional vacuum tube amplification system 400 comprises a high/low voltage DC power circuit 410, a first vacuum tube amplification load circuit 420, a second vacuum tube amplification load circuit 430 and a power transformer 440. The signal ground wire of the first vacuum tube amplification load circuit 420 and the signal ground wire of the second vacuum tube amplification load circuit 430 have a common voltage reference point (Both the first vacuum tube amplification load circuit 420 and the second vacuum tube amplification load circuit 430 are electrically connected to a sound signal common ground end 460.) The grounds 472, 474 shown in FIG. 4A are compliance grounds. The signal ground wire running directions 421, 423, 425, 427, 431, 433, 435, 437 in FIG. 4A show that the signal ground wires form a closed loop 480, causing the conventional vacuum tube amplification system 400 to generate enormous residual noise.

Figure 4B:
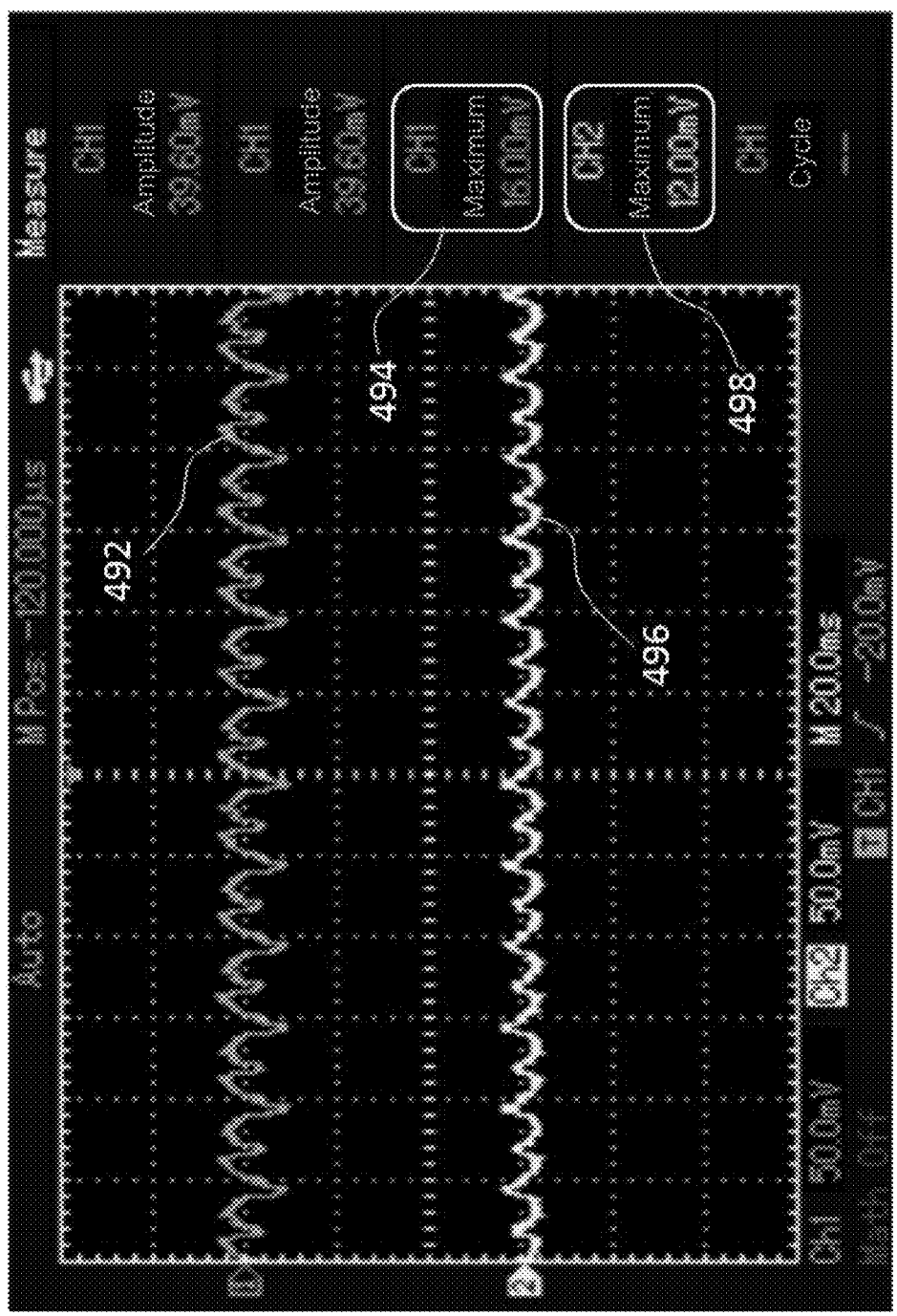
FIG. 4B (PRIOR ART) shows results of a residual noise test conducted on the conventional vacuum tube amplification system of FIG. 4A.

FIG. 4B shows results of a residual noise test conducted on the conventional vacuum tube amplification system of FIG. 4A. The signal 492 shown in FIG. 4B indicates that the first vacuum tube amplification load circuit 420 has maximum residual noise level 494 of 16 mv/1.414=11.3 mv RMS. The signal 496 indicates that the second vacuum tube amplification load circuit 430 has maximum residual noise level 498 of 12 mv/1.414=8.5 mv RMS. Obviously, the first vacuum tube amplification load circuit 420 and the second vacuum tube amplification load circuit 430 of the conventional vacuum tube amplification system 400 have high noise level and thus can be easily heard by users within a short distance, such as 20 cm.

Figure 5A:
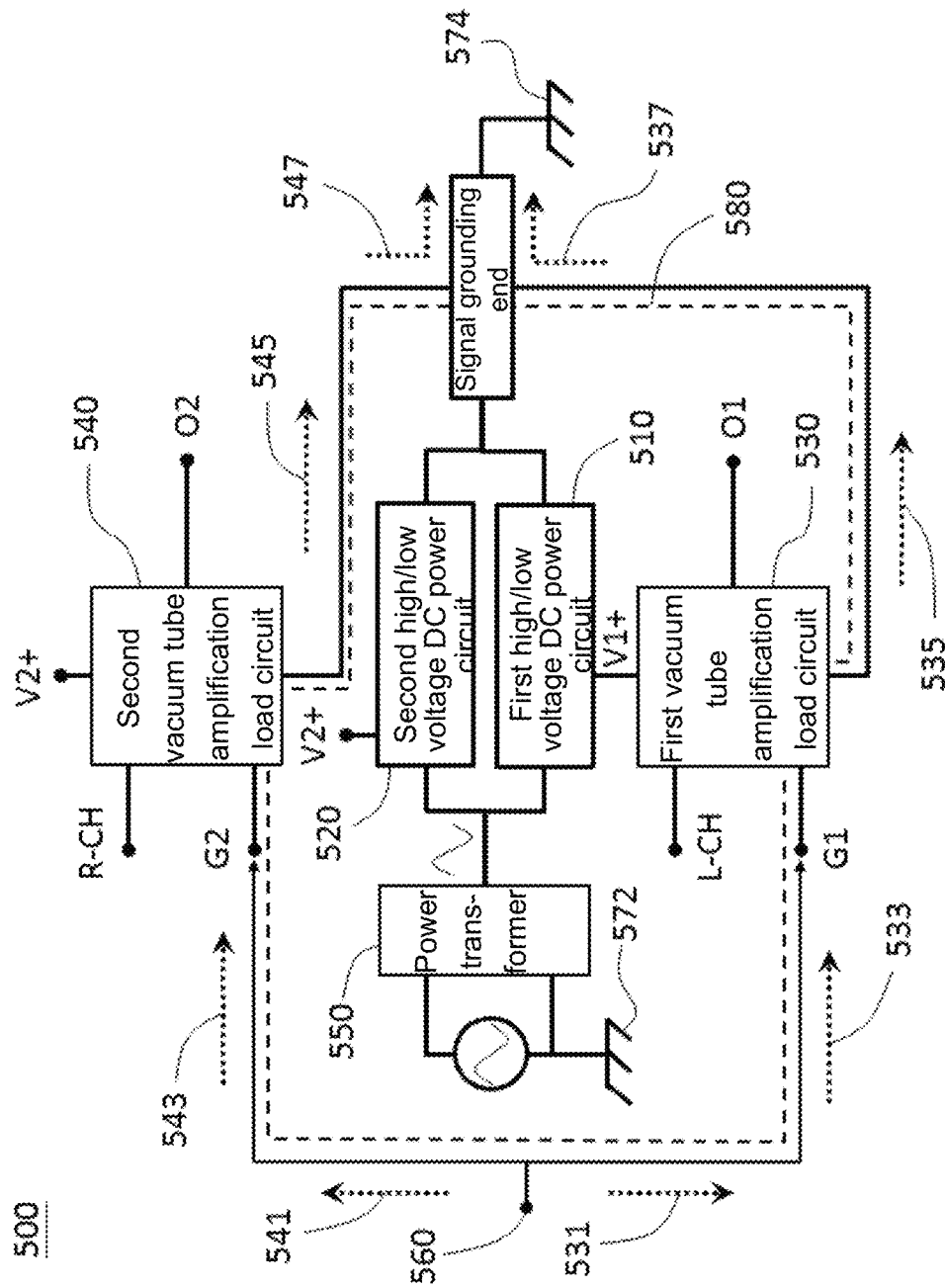
FIG. 5A (PRIOR ART) is a block diagram of a conventional vacuum tube amplification system according to a specific embodiment.

Referring to FIG. 5A, there is shown a block diagram of a conventional vacuum tube amplification system according to a specific embodiment. As shown in FIG. 5A, a conventional vacuum tube amplification system 500 comprises a first high/low voltage DC power circuit 510, a second high/low voltage DC power circuit 520, a first vacuum tube amplification load circuit 530, a second vacuum tube amplification load circuit 540 and a power transformer 550. The signal ground wire of the first vacuum tube amplification load circuit 530 and the signal ground wire of the second vacuum tube amplification load circuit 540 have a common voltage reference point (Both first vacuum tube amplification load circuit 530 and second vacuum tube amplification load circuit 540 are electrically connected to a sound signal common ground end 560.) The grounds 572, 574 shown in FIG. 5A are compliance grounds. The signal ground wire running directions 531, 533, 535, 537, 541, 543, 545, 547 shown in FIG. 5A indicate that the signal ground wires form a closed loop 580, causing the conventional vacuum tube amplification system 500 to generate enormous residual noise.

Figure 5B:
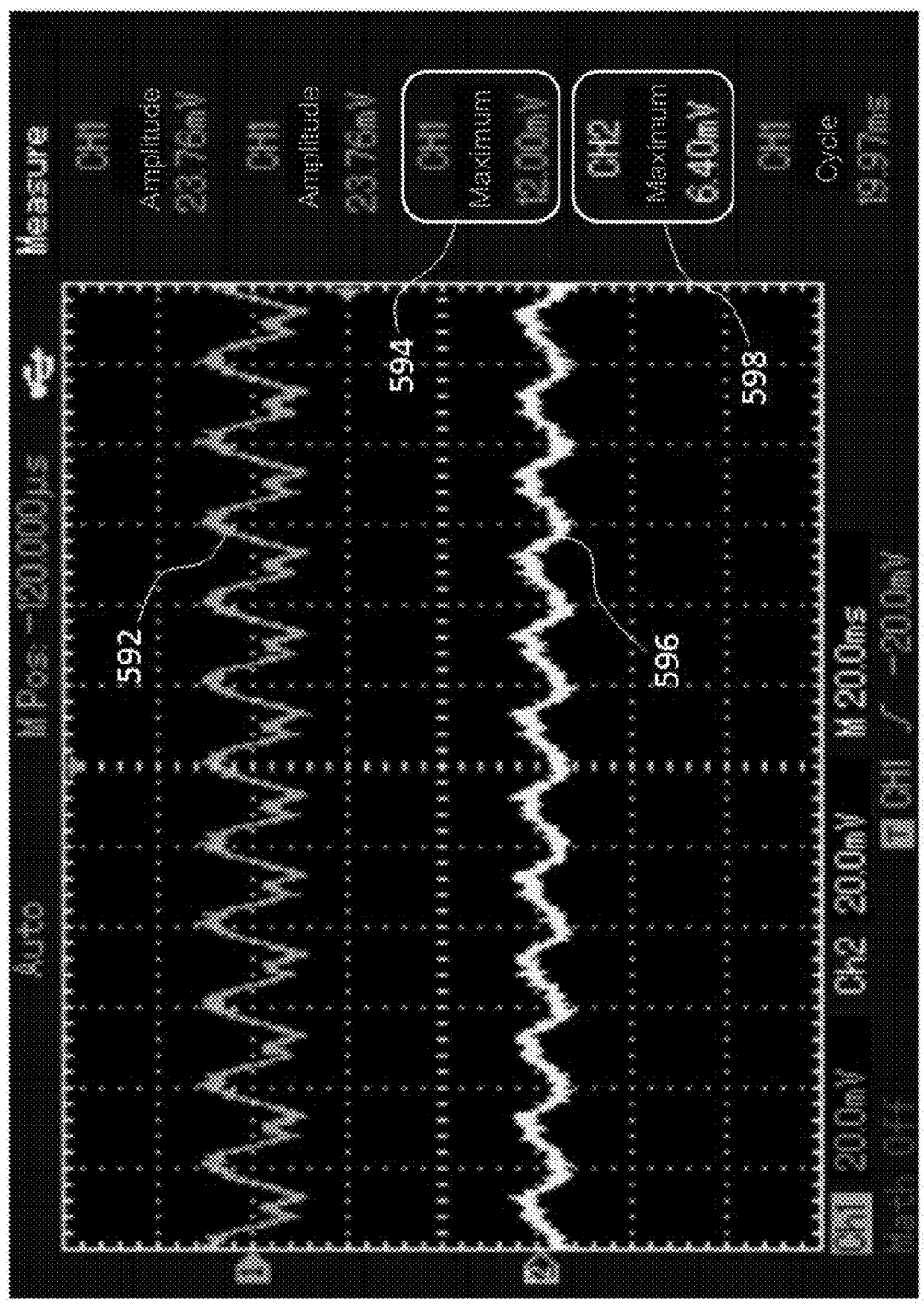
FIG. 5B (PRIOR ART) shows results of a residual noise test conducted on the conventional vacuum tube amplification system of FIG. 5A.

FIG. 5B shows results of a residual noise test conducted on the conventional vacuum tube amplification system of FIG. 5A. The signal 592 shown in FIG. 5B indicates that the first vacuum tube amplification load circuit 530 has maximum residual noise level 594 of 12 mv/1.414=8.5 mv RMS. The signal 596 indicates that the second vacuum tube amplification load circuit 540 has maximum residual noise level 598 of 6.4 mv/1.414=4.5 mv RMS. Obviously, the first vacuum tube amplification load circuit 530 and second vacuum tube amplification load circuit 540 of the conventional vacuum tube amplification system 500 have high noise level and thus can be easily heard by users within a short distance, such as 20 cm.

Figure 6A:
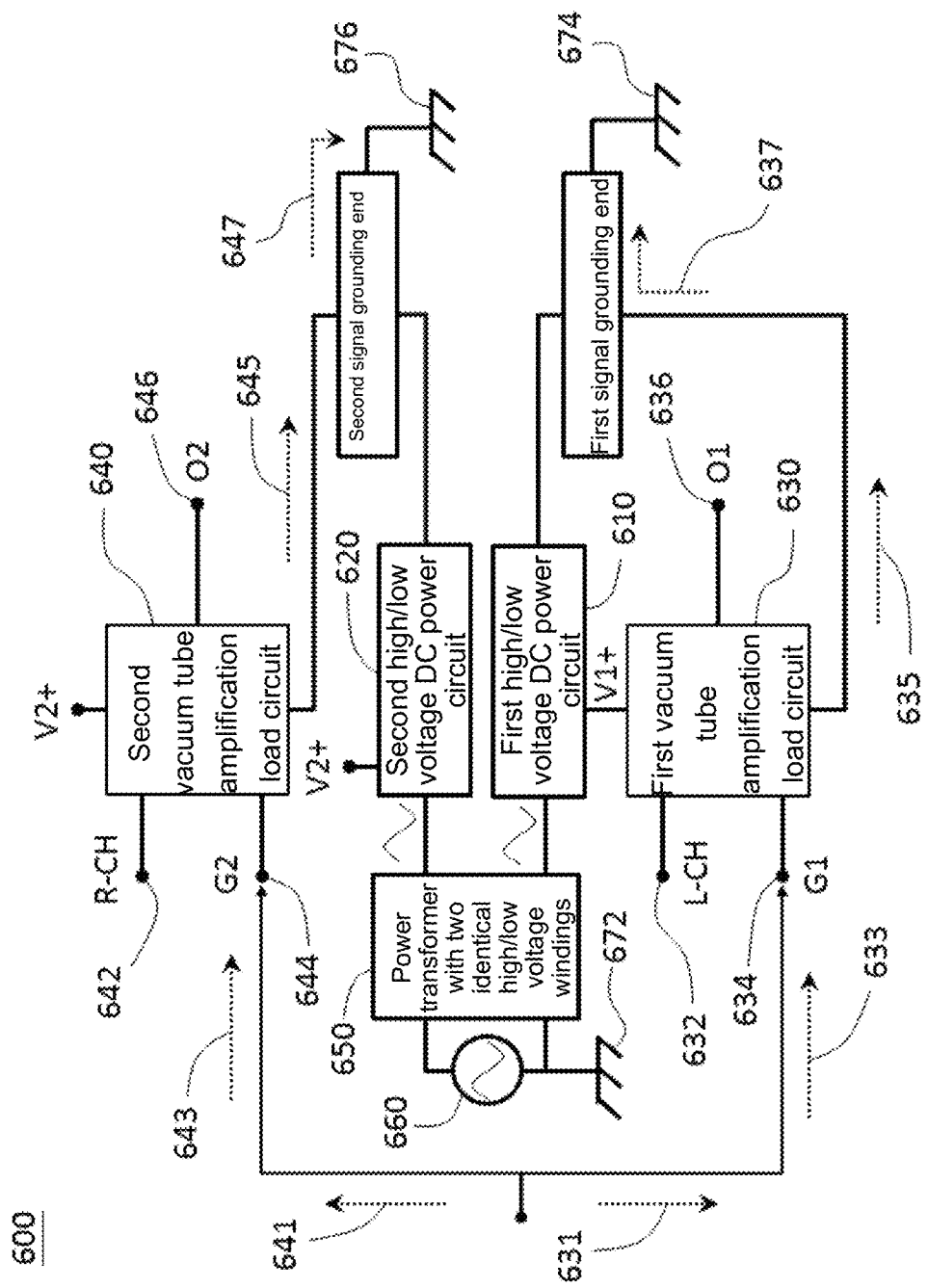
FIG. 6A is a block diagram of the vacuum tube amplification system according to a specific embodiment of the present disclosure.

Referring to FIG. 6A, there is shown a block diagram of the vacuum tube amplification system according to a specific embodiment of the present disclosure. In the embodiment illustrated by FIG. 6A, a vacuum tube amplification system 600 comprises a first high/low voltage DC power circuit 610, a second high/low voltage DC power circuit 620, a first vacuum tube amplification load circuit 630, a second vacuum tube amplification load circuit 640 and a power transformer 650. In a specific embodiment, the power transformer 650 is a power transformer with two identical high/low voltage windings. The power transformer 650 has two identical high/low voltage windings (i.e., the first induction coil and second induction coil described later) for providing first AC current and second AC current to the first high/low voltage DC power circuit 610 and the second high/low voltage DC power circuit 620, respectively. The first vacuum tube amplification load circuit 630 has a first input signal end 632, first output signal end 636 and first grounding end 634. The first input signal end 632 electrically receives a first audio input signal. The second vacuum tube amplification load circuit 640 has a second input signal end 642, second output signal end 646 and second grounding end 644. The second input signal end 642 electrically receives a second audio input signal. The first grounding end 634 is not directly electrically connected to the second grounding end 644.

In a specific embodiment, with the circuit connection technique illustrated by FIG. 3A (referring to the jumper-wire zero-ohm resistor 337 and the compliance ground 338 shown in FIG. 3A, and referring, in another specific embodiment, to FIG. 6A), the first grounding end 634 leads to (for example, electrically connects to) the compliance ground 674 through the first vacuum tube amplification load circuit 630 and a jumper-wire zero-ohm resistor, and the second grounding end 644 leads to (for example, electrically connects to) the compliance ground 676 through the second vacuum tube amplification load circuit 640 and a jumper-wire zero-ohm resistor. The compliance ground 676, compliance ground 674, and compliance ground 672 of the utility power alternating voltage 660 are identical compliance grounds, such that the first grounding end 634 and second grounding end 644 are each electrically connected to the compliance ground 672 of the utility power alternating voltage 660 through a jumper-wire zero-ohm resistor. FIG. 6A shows signal ground wire running directions 631, 633, 635, 637, 641, 643, 645, 647. The residual noise level is extremely low, because the left-channel signal ground wire and right-channel signal ground wire are separate and do not form a closed loop.

In a specific embodiment, the first audio input signal is a left-channel audio signal, and the second audio input signal is a right-channel audio signal. In a specific embodiment, the first high/low voltage DC power circuit 610 outputs a first DC voltage to be supplied to the first vacuum tube amplification load circuit 630 for operation thereof, and the second high/low voltage DC power circuit 620 outputs a second DC voltage to be supplied to the second vacuum tube amplification load circuit 640 for operation thereof. In a specific embodiment, the first DC voltage comprises a first DC high voltage and a first DC low voltage, whereas the first vacuum tube amplification load circuit 630 comprises a plurality of first vacuum tubes, wherein the first DC high voltage and first DC low voltage are supplied to the first vacuum tubes for operation thereof. The second DC voltage comprises a second DC high voltage and a second DC low voltage. The second vacuum tube amplification load circuit 640 comprises a plurality of second vacuum tubes. The second DC high voltage and second DC low voltage are supplied to the second vacuum tubes for operation thereof.

In a specific embodiment, the power transformer 650 (as mentioned before, in a specific embodiment, the power transformer 650 is a power transformer with two identical high/low voltage windings) has an exciting coil, a first induction coil and a second induction coil. The exciting coil receives utility power alternating voltage 660. The first induction coil provides a first utility alternating power to the first high/low voltage DC power circuit 610. The second induction coil provides a second utility alternating power to the second high/low voltage DC power circuit 620. In a specific embodiment, the first high/low voltage DC power circuit 610 and second high/low voltage DC power circuit 620 are electrically connected to the first grounding end 634 and second grounding end 644, respectively. In a specific embodiment, the first high/low voltage DC power circuit 610 comprises a first high voltage DC power circuit and a first low voltage DC power circuit, whereas the second high/low voltage DC power circuit 620 comprises a second high voltage DC power circuit and a second low voltage DC power circuit. The first high voltage DC power circuit and first low voltage DC power circuit are electrically connected to the first grounding end 634 of the first vacuum tube amplification load circuit 630. The second high voltage DC power circuit and second low voltage DC power circuit are electrically connected to the second grounding end 644 of the second vacuum tube amplification load circuit 640. The first induction coil of the power transformer 650 has a first high voltage induction coil and a first low voltage induction coil. The second induction coil of the power transformer 650 has a second high voltage induction coil and a second low voltage induction coil. The exciting coil of the power transformer 650 is electrically connected to the utility power alternating voltage 660. The first high voltage DC power circuit is electrically connected to the first high voltage induction coil of the power transformer 650 to rectify and output the first DC high voltage. The first low voltage DC power circuit is electrically connected to the first low voltage induction coil of the power transformer 650 to rectify and output the first DC low voltage. The second high voltage DC power circuit is electrically connected to the second high voltage induction coil of the power transformer 650 to rectify and output the second DC high voltage. The second low voltage DC power circuit is electrically connected to the second low voltage induction coil of the power transformer 650 to rectify and output the second DC low voltage. Thus, the first high/low voltage DC power circuit 610 outputs the first DC high voltage and first DC low voltage to be supplied to the first vacuum tube amplification load circuit 630 for operation thereof. The second high/low voltage DC power circuit 620 outputs the second DC high voltage and second DC low voltage to be supplied to the second vacuum tube amplification load circuit 640 for operation thereof. In a specific embodiment, the first induction coil and second induction coil have the same winding configuration (The first high/low voltage winding of the first induction coil and the second high/low voltage winding of the second induction coil have the same winding configuration.) Therefore, the first high voltage induction coil and second high voltage induction coil have the same winding configuration, whereas the first low voltage induction coil and second low voltage induction coil have the same winding configuration. Unlike the configuration shown in FIG. 7A, the configuration of the vacuum tube amplification system 600 (the first high/low voltage DC power circuit 610 and second high/low voltage DC power circuit 620 share the power transformer 650) not only saves cost but also reduces product weight and volume.

In a specific embodiment, a plurality of first vacuum tubes of the first vacuum tube amplification load circuit 630 comprises a first vacuum tube first stage amplification circuit, first vacuum tube second stage amplification circuit and first vacuum tube power amplification circuit. In the specific embodiment, the first vacuum tube amplification load circuit 630 comprises the same constituent elements as the vacuum tube amplification load circuit 220 shown in FIG. 2. The first vacuum tube power amplification circuit provides a power-amplified signal from the first output signal end 636 to a first audio output transformer. Then, the first audio output transformer provides the processed signal to the first speaker. Finally, the first speaker plays the processed audio signal. In a specific embodiment, both the first vacuum tube first stage amplification circuit and first vacuum tube second stage amplification circuit use three-terminal vacuum tubes, whereas the first vacuum tube power amplification circuit uses five-terminal vacuum tubes.

In a specific embodiment, a plurality of second vacuum tubes of the second vacuum tube amplification load circuit 640 comprises a second vacuum tube first stage amplification circuit, second vacuum tube second stage amplification circuit and second vacuum tube power amplification circuit. In the specific embodiment, the second vacuum tube amplification load circuit 640 comprises the same constituent elements as the vacuum tube amplification load circuit 220 shown in FIG. 2. The second vacuum tube power amplification circuit provides a power-amplified signal from the second output signal end 646 to a second audio output transformer. Then, the second audio output transformer provides the processed signal to the second speaker. Finally, the second speaker plays the processed audio signal. In a specific embodiment, both the second vacuum tube first stage amplification circuit and the second vacuum tube second stage amplification circuit use three-terminal vacuum tubes, whereas the second vacuum tube power amplification circuit uses five-terminal vacuum tubes.

Figure 6B:
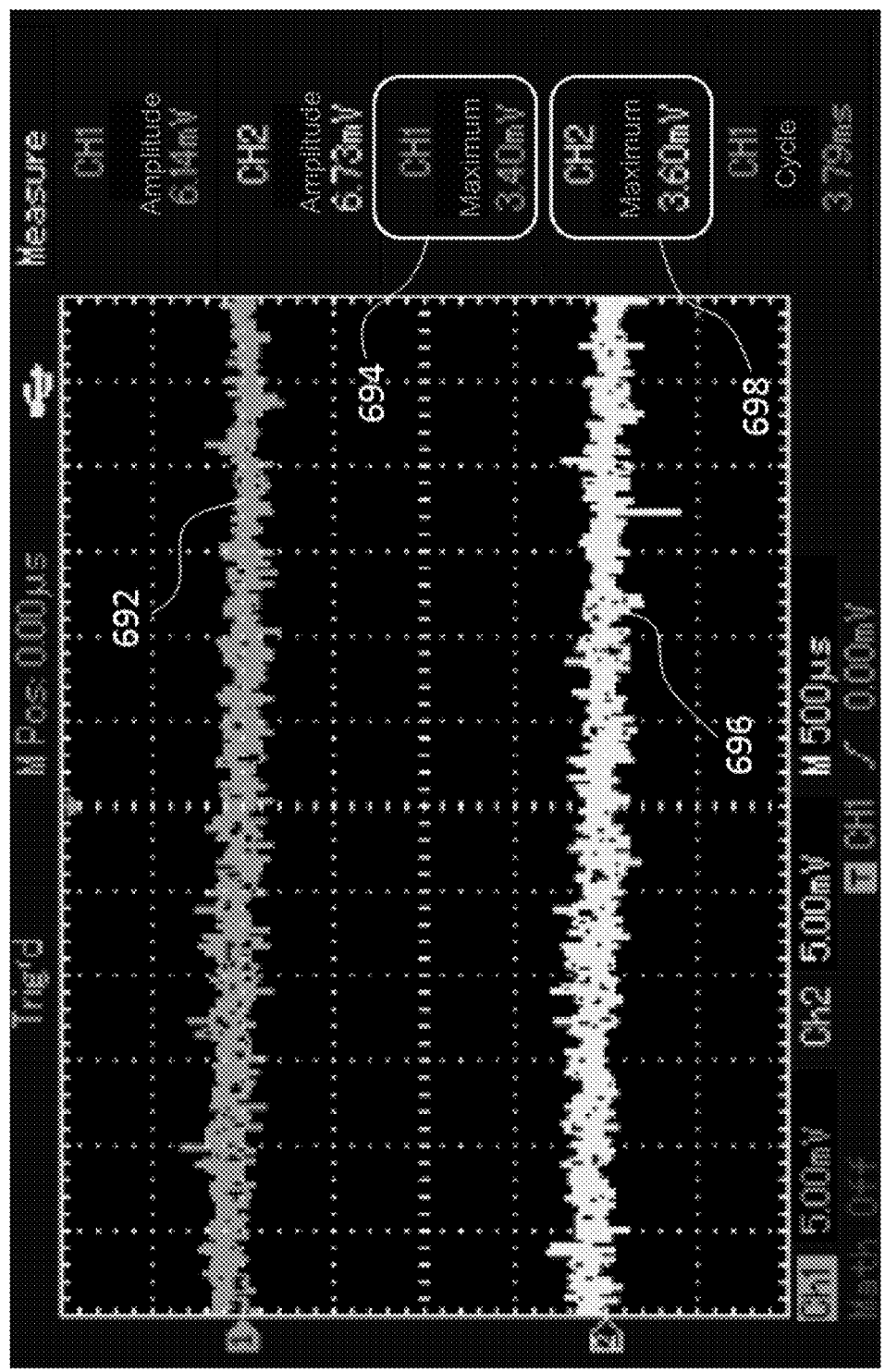
FIG. 6B shows results of a residual noise test conducted on the vacuum tube amplification system of FIG. 6A.

FIG. 6B shows results of a residual noise test conducted on the vacuum tube amplification system of the present disclosure of FIG. 6A. The signal 692 shown in FIG. 6B indicates that the first vacuum tube amplification load circuit 630 has maximum residual noise level 694 of 3.4 mv/1.414=2.4 mv RMS. The signal 696 indicates that the second vacuum tube amplification load circuit 640 has maximum residual noise level 698 of 3.6 mv/1.414=2.5 mv RMS. Obviously, the noise level of the first vacuum tube amplification load circuit 630 and second vacuum tube amplification load circuit 640 of the vacuum tube amplification system 600 is much lower than the residual noise level of the conventional vacuum tube amplification systems, and has little "hum" sound wave form or pulse noise interference.

Figure 7A:
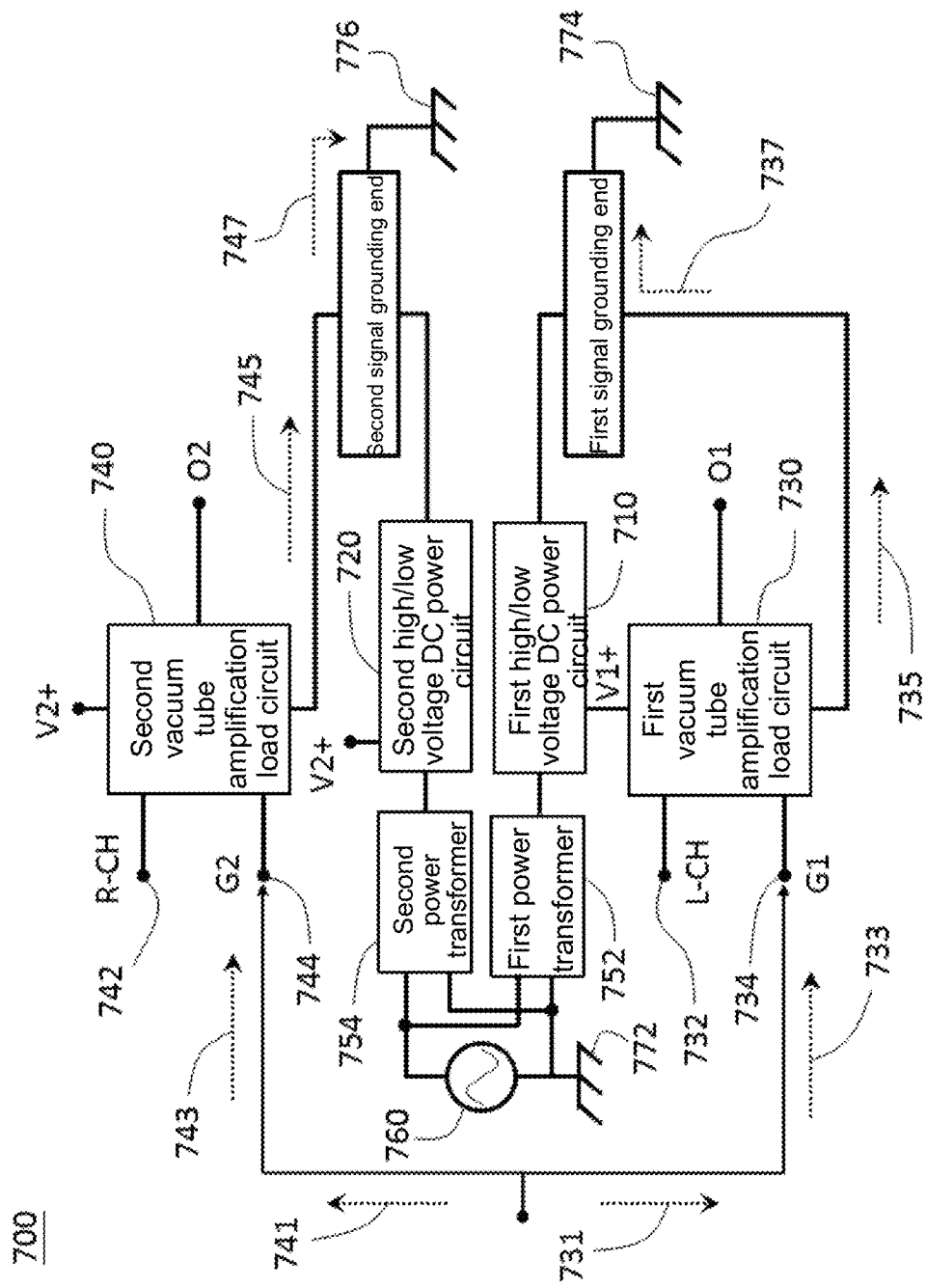
FIG. 7A is a block diagram of the vacuum tube amplification system according to a specific embodiment of the present disclosure.

Referring to FIG. 7A, there is shown a block diagram of the vacuum tube amplification system according to a specific embodiment of the present disclosure. In the embodiment illustrated by FIG. 7A, a vacuum tube amplification system 700 comprises a first high/low voltage DC power circuit 710, second high/low voltage DC power circuit 720, first vacuum tube amplification load circuit 730, second vacuum tube amplification load circuit 740, first power transformer 752 and second power transformer 754. The first high/low voltage DC power circuit 710 and first power transformer 752 are regarded as the first power circuit, whereas the second high/low voltage DC power circuit 720 and second power transformer 754 are regarded as the second power circuit.

In a specific embodiment, the first power transformer 752 has a first exciting coil, a first high voltage induction coil and a first low voltage induction coil. The first high/low voltage DC power circuit 710 comprises a first high voltage DC power circuit and a first low voltage DC power circuit. The first high voltage DC power circuit is electrically connected to the first high voltage induction coil to rectify and output a first DC high voltage. The first low voltage DC power circuit is electrically connected to the first low voltage induction coil to rectify and output a first DC low voltage. The first exciting coil of the first power transformer 752 is electrically connected to a utility power alternating voltage 760. The first high voltage DC power circuit and first low voltage DC power circuit are electrically connected to a first grounding end 734 of the first vacuum tube amplification load circuit 730.

In a specific embodiment, the second power transformer 754 has a second exciting coil, a second high voltage induction coil and a second low voltage induction coil. The second high/low voltage DC power circuit 720 comprises a second high voltage DC power circuit and a second low voltage DC power circuit. The second high voltage DC power circuit is electrically connected to the second high voltage induction coil to rectify and output the second DC high voltage. The second low voltage DC power circuit is electrically connected to the second low voltage induction coil to rectify and output a second DC low voltage. The second exciting coil of the second power transformer 754 is electrically connected to the utility power alternating voltage 760. The second high voltage DC power circuit and second low voltage DC power circuit are electrically connected to the second grounding end 744 of the second vacuum tube amplification load circuit 740.

In a specific embodiment, the first vacuum tube amplification load circuit 730 has a first input signal end 732 and the first grounding end 734, and the first input signal end 732 electrically receives a first audio input signal. The second vacuum tube amplification load circuit 740 has a second input signal end 742 and a second grounding end 744, and the second input signal end 742 electrically receives a second audio input signal. The first grounding end 734 is not directly connected to the second grounding end 744. In a specific embodiment, the first audio input signal is a left-channel audio signal, and the second audio input signal is a right-channel audio signal. In a specific embodiment, the first vacuum tube amplification load circuit 730 comprises a first vacuum tube amplification circuit and uses the first DC voltage output by the first power circuit as operating voltage, wherein the first DC voltage comprises the first DC low voltage and first DC high voltage. The second vacuum tube amplification load circuit 740 comprises a second vacuum tube amplification circuit and uses the second DC voltage output by the second power circuit as operating voltage, wherein the second DC voltage comprises the second DC low voltage and second DC high voltage.

In a specific embodiment, with the circuit connection technique illustrated by FIG. 3A (referring to the jumper-wire zero-ohm resistor 337 and the compliance ground 338 in FIG. 3A, and referring, in another specific embodiment, to FIG. 7A), the first grounding end 734 is electrically connected to the compliance ground 774 through a jumper-wire zero-ohm resistor, whereas the second grounding end 744 is electrically connected to the compliance ground 776 through a jumper-wire zero-ohm resistor, wherein the compliance ground 776, compliance ground 774, and compliance ground 772 of the utility power alternating voltage 760 are identical compliance grounds, such that the first grounding end 734 and second grounding end 744 are each electrically connected to the compliance ground 772 of the utility power alternating voltage 760 through a jumper-wire zero-ohm resistor. FIG. 7A shows signal ground wire running directions 731, 733, 735, 737, 741, 743, 745, 747. The residual noise level is extremely low, because the left-channel signal ground wire and right-channel signal ground wire are separate and do not form a closed loop.

Figure 7B:
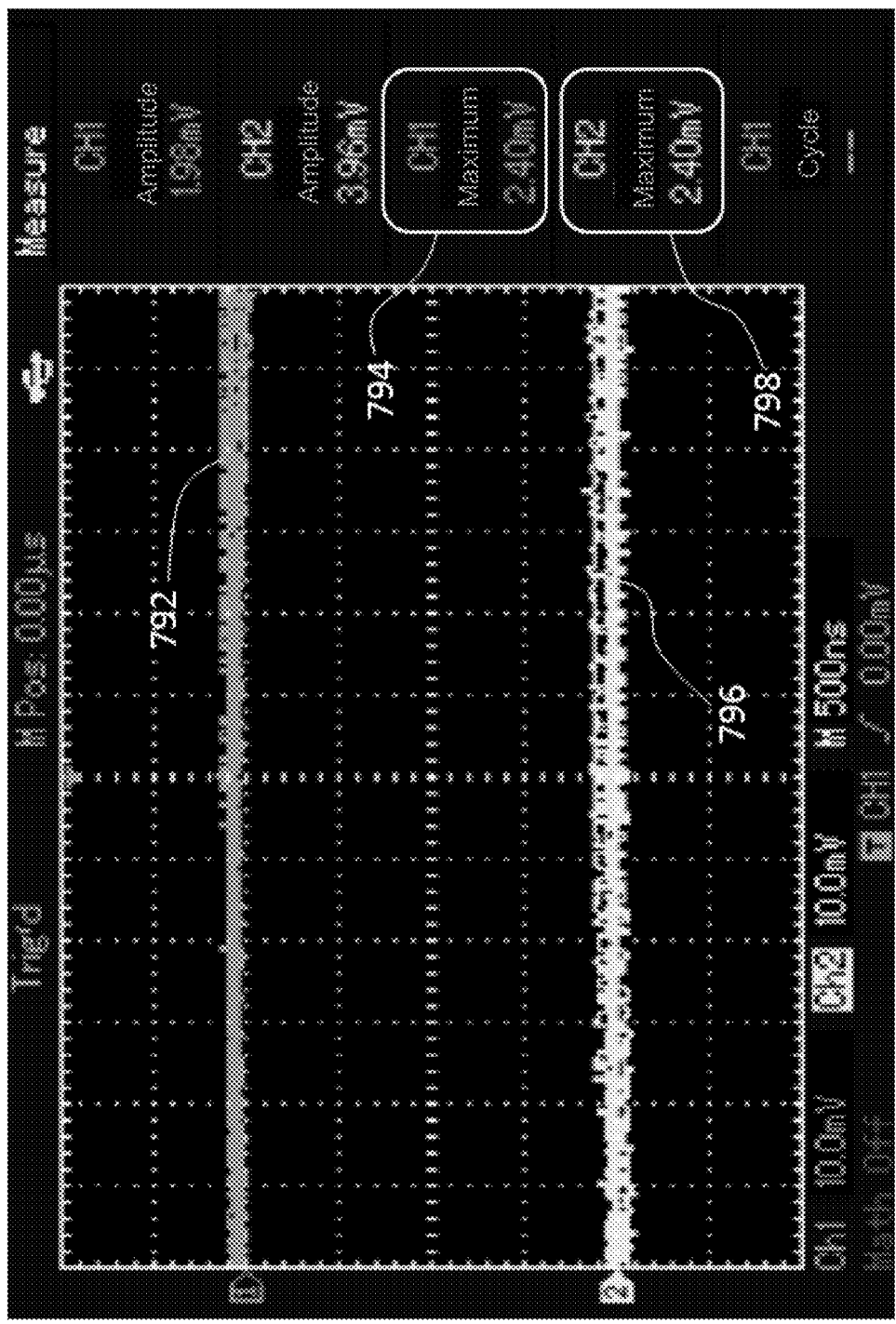
FIG. 7B shows results of a residual noise test conducted on the vacuum tube amplification system of FIG. 7A.

FIG. 7B shows results of a residual noise test conducted on the vacuum tube amplification system of FIG. 7A. The signal 792 shown in FIG. 7B indicates that the first vacuum tube amplification load circuit 730 has maximum residual noise level 794 of 2.4 mv/1.414=1.845 mv RMS. The signal 796 indicates that the second vacuum tube amplification load circuit 740 has maximum residual noise level 798 of 2.4 mv/1.414=1.845 mv RMS. Obviously, the noise level of the first vacuum tube amplification load circuit 730 and second vacuum tube amplification load circuit 740 of the vacuum tube amplification system 700 is much lower than the residual noise level of the conventional vacuum tube amplification systems, approximates to performance of transistors, and has little "hum" sound wave form or pulse noise interference. Therefore, the noise level of the first vacuum tube amplification load circuit 730 and second vacuum tube amplification load circuit 740 approximates to the residual noise level of transistor-based amplification systems; thus, the vacuum tube amplification system of FIG. 7A is not only applicable to desktop products but also can be listened to within a short distance.

Figure 8:
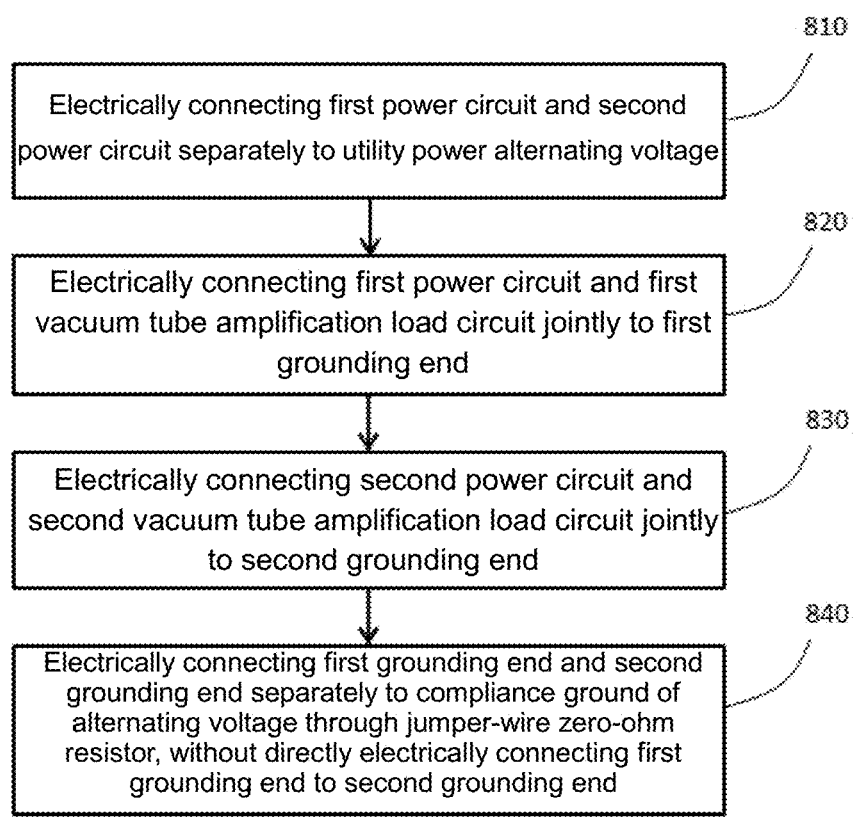
FIG. 8 is a flowchart of a grounding method for a vacuum tube amplification system according to a specific embodiment of the present disclosure.

Referring to FIG. 8, there is shown a flowchart of a grounding method for a vacuum tube amplification system according to a specific embodiment of the present disclosure. In the embodiment illustrated by FIG. 8, a vacuum tube amplification system which a grounding method 800 is applicable to comprises a first power circuit, a first vacuum tube amplification load circuit, a second power circuit and a second vacuum tube amplification load circuit. The first power circuit supplies power to the first vacuum tube amplification load circuit for operation thereof. The second power circuit supplies power to the second vacuum tube amplification load circuit for operation thereof. The grounding method 800 begins with step 810 which entails electrically connecting the first power circuit and second power circuit separately to the utility power alternating voltage. Then, step 820 entails electrically connecting the first power circuit and first vacuum tube amplification load circuit jointly to the first grounding end. After that, step 830 entails electrically connecting the second power circuit and second vacuum tube amplification load circuit jointly to the second grounding end. Then, step 840 entails electrically connecting the first grounding end and second grounding end separately to the compliance ground of the utility power alternating voltage through a jumper-wire zero-ohm resistor, without electrically connecting the first grounding end directly to the second grounding end.

In a specific embodiment, the first power circuit comprises a first power transformer, a first high voltage DC power circuit and a first low voltage DC power circuit. The first power transformer has a first exciting coil, a first high voltage induction coil and a first low voltage induction coil. The first high voltage DC power circuit is electrically connected to the first high voltage induction coil to rectify and output a first DC high voltage. The first low voltage DC power circuit is electrically connected to the first low voltage induction coil to rectify and output the first DC low voltage. The first exciting coil of the first power transformer is electrically connected to the utility power alternating voltage. The first high voltage DC power circuit and first low voltage DC power circuit are electrically connected to the first grounding end. The first DC low voltage and first DC high voltage are supplied to the first vacuum tube amplification load circuit.

In a specific embodiment, the second power circuit comprises a second power transformer, a second high voltage DC power circuit and a second low voltage DC power circuit. The second power transformer has a second exciting coil, a second high voltage induction coil and a second low voltage induction coil. The second high voltage DC power circuit is electrically connected to the second high voltage induction coil to rectify and output the second DC high voltage. The second low voltage DC power circuit is electrically connected to the second low voltage induction coil to rectify and output the second DC low voltage. The second exciting coil of the second power transformer is electrically connected to the utility power alternating voltage. The second high voltage DC power circuit and second low voltage DC power circuit are electrically connected to the second grounding end. The second DC low voltage and second DC high voltage are supplied to the second vacuum tube amplification load circuit.

Figure 9:
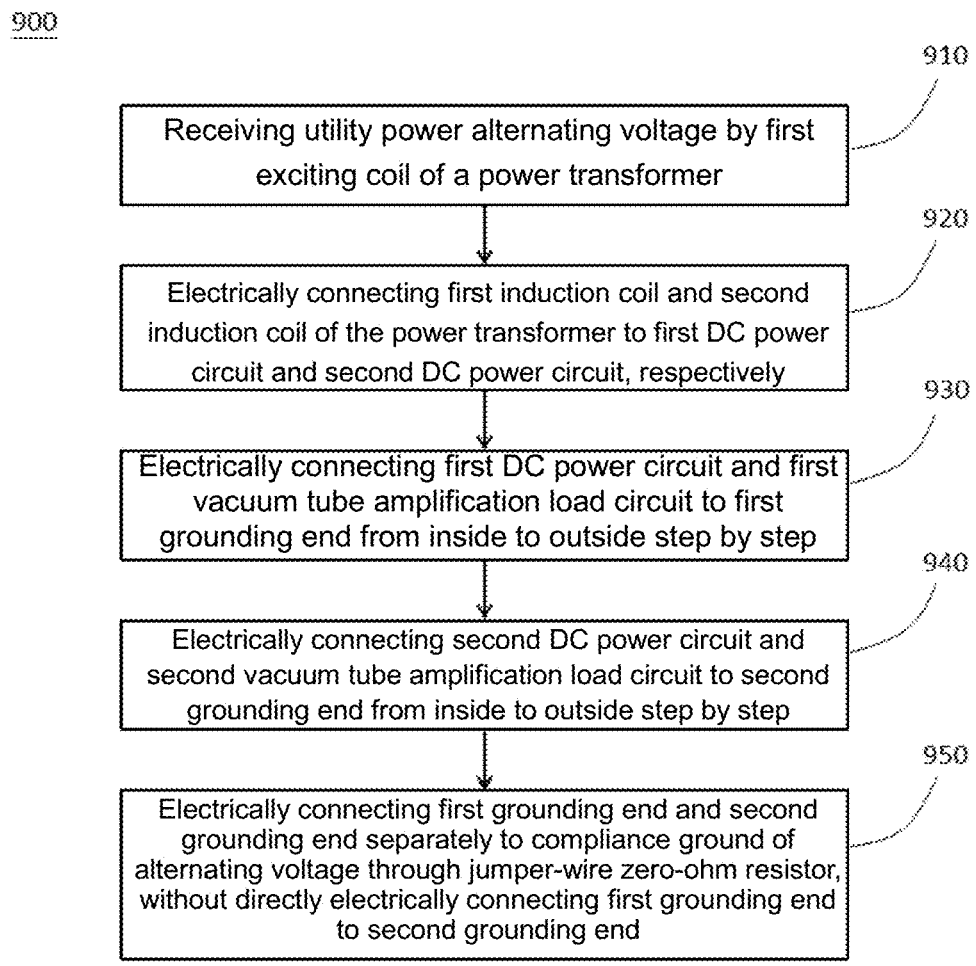
FIG. 9 is a flowchart of a grounding method for a vacuum tube amplification system according to a specific embodiment of the present disclosure.

Referring to FIG. 9, there is shown a flowchart of a grounding method for a vacuum tube amplification system according to a specific embodiment of the present disclosure. In the embodiment illustrated by FIG. 9, a grounding method 900 is applicable to a vacuum tube amplification system which comprises a first DC power circuit, a first vacuum tube amplification load circuit, a second DC power circuit and a second vacuum tube amplification load circuit. The first DC power circuit supplies power to the first vacuum tube amplification load circuit for operation thereof. The second DC power circuit supplies power to the second vacuum tube amplification load circuit for operation thereof. The grounding method 900 begins with step 910 which entails receiving utility power alternating voltage by a first exciting coil of a power transformer. After that, step 920 entails electrically connecting the first induction coil and second induction coil of the power transformer to the first DC power circuit and second DC power circuit, respectively. Then, step 930 entails electrically connecting the first DC power circuit and first vacuum tube amplification load circuit jointly to the first grounding end. After that, step 940 entails electrically connecting the second DC power circuit and second vacuum tube amplification load circuit jointly to the second grounding end. Next, step 950 entails electrically connecting the first grounding end and second grounding end separately to the compliance ground of the utility power alternating voltage through a jumper-wire zero-ohm resistor, without electrically connecting the first grounding end directly to the second grounding end. In a specific embodiment, the vacuum tube amplification system comprises the power transformer.

A vacuum tube amplification system capable of reducing residual noise and a grounding method thereof according to the present disclosure are illustrated by the aforesaid embodiments, depicted by the accompanying drawings, and described above. Although the present disclosure is illustrated by preferred embodiments, the preferred embodiments are not restrictive of the present disclosure. Various changes can be made by persons skilled in the art to the preferred embodiments without departing from the scope and spirit of the present disclosure and must be deemed falling within the scope of the present disclosure. Accordingly, the real scope and spirit of the present disclosure should be defined by the appended claims.

What is claimed is:
1. A vacuum tube amplification system, comprising:
a first power circuit electrically connected to a utility power alternating voltage to transform the utility power alternating voltage into a first DC voltage and output the first DC voltage;
a first vacuum tube amplification load circuit having a first input signal end and a first grounding end, the first vacuum tube amplification load circuit comprising a first vacuum tube amplification circuit, and using the first DC voltage as operating voltage;
a second power circuit electrically connected to the utility power alternating voltage to transform the utility power alternating voltage into a second DC voltage and output the second DC voltage; and
a second vacuum tube amplification load circuit having a second input signal end and a second grounding end, the second vacuum tube amplification load circuit comprising a second vacuum tube amplification circuit, and using the second DC voltage as operating voltage,
wherein the first grounding end of the first vacuum tube amplification load circuit is not directly electrically connected to the second grounding end of the second vacuum tube amplification load circuit, the first grounding end and the second grounding end are each electrically connected to a compliance ground of the utility power alternating voltage through a jumper-wire zero-ohm resistor.

2. The vacuum tube amplification system of claim 1, wherein the first input signal end electrically receives a first audio input signal, and the second input signal end electrically receives a second audio input signal.

3. The vacuum tube amplification system of claim 2, wherein the first audio input signal is a left-channel audio signal, and the second audio input signal is a right-channel audio signal.

4. The vacuum tube amplification system of claim 1, wherein the first power circuit comprises: a first power transformer having an exciting coil, a high voltage induction coil and a low voltage induction coil; a high voltage DC power circuit electrically connected to the high voltage induction coil to rectify and output a DC high voltage; and a low voltage DC power circuit electrically connected to the low voltage induction coil to rectify and output a DC low voltage, wherein the exciting coil of the first power transformer is electrically connected to the utility power alternating voltage, whereas the high voltage DC power circuit and the low voltage DC power circuit are electrically connected to the first grounding end of the first vacuum tube amplification load circuit, wherein the first DC voltage comprises the DC low voltage and the DC high voltage.

5. The vacuum tube amplification system of claim 1, wherein the second power circuit comprises: a second power transformer having an exciting coil, a high voltage induction coil and a low voltage induction coil; a high voltage DC power circuit electrically connected to the high voltage induction coil to rectify and output a DC high voltage; and a low voltage DC power circuit electrically connected to the low voltage induction coil to rectify and output a DC low voltage, wherein the exciting coil of the second power transformer is electrically connected to the utility power alternating voltage, whereas the high voltage DC power circuit and the low voltage DC power circuit are electrically connected to the second grounding end of the second vacuum tube amplification load circuit, wherein the second DC voltage comprises the DC low voltage and the DC high voltage.

6. A grounding method for a vacuum tube amplification system, the vacuum tube amplification system comprising a first power circuit, a first vacuum tube amplification load circuit, a second power circuit and a second vacuum tube amplification load circuit, wherein the first power circuit supplies power to the first vacuum tube amplification load circuit for operation thereof, and the second power circuit supplies power to the second vacuum tube amplification load circuit for operation thereof, the grounding method comprising the steps of:
electrically connecting the first power circuit and the second power circuit separately to a utility power alternating voltage;
electrically connecting the first power circuit and the first vacuum tube amplification load circuit jointly to a first grounding end;
electrically connecting the second power circuit and the second vacuum tube amplification load circuit jointly to a second grounding end; and
electrically connecting the first grounding end and the second grounding end separately to a compliance ground of the utility power alternating voltage through a jumper-wire zero-ohm resistor, without electrically connecting the first grounding end directly to the second grounding end.

7. The grounding method of claim 6, wherein the first power circuit comprises: a first power transformer having an exciting coil, a high voltage induction coil and a low voltage induction coil; a high voltage DC power circuit electrically connected to the high voltage induction coil to rectify and output a DC high voltage; and a low voltage DC power circuit electrically connected to the low voltage induction coil to rectify and output a DC low voltage, wherein the exciting coil of the first power transformer is electrically connected to the utility power alternating voltage, whereas the high voltage DC power circuit and the low voltage DC power circuit are electrically connected to the first grounding end, wherein the DC low voltage and the DC high voltage are supplied to the first vacuum tube amplification load circuit.

8. The grounding method of claim 6, wherein the second power circuit comprises: a second power transformer having an exciting coil, a high voltage induction coil and a low voltage induction coil; a high voltage DC power circuit electrically connected to the high voltage induction coil to rectify and output a DC high voltage; and a low voltage DC power circuit electrically connected to the low voltage induction coil to rectify and output a DC low voltage, wherein the exciting coil of the second power transformer is electrically connected to the utility power alternating voltage, whereas the high voltage DC power circuit and the low voltage DC power circuit are electrically connected to the second grounding end, wherein the DC low voltage and the DC high voltage are supplied to the second vacuum tube amplification load circuit.

9. A vacuum tube amplification system, comprising:
a first vacuum tube amplification load circuit having a first input signal end, a first output signal end and a first grounding end, the first input signal end electrically receiving a first audio input signal;
a first DC power circuit for outputting a first DC voltage to be supplied to the first vacuum tube amplification load circuit for operation thereof;
a second vacuum tube amplification load circuit having a second input signal end, a second output signal end and a second grounding end, the second input signal end electrically receiving a second audio input signal;
a second DC power circuit for outputting a second DC voltage to be supplied to the second vacuum tube amplification load circuit for operation thereof; and
a power transformer having an exciting coil, a first induction coil and a second induction coil, the exciting coil receiving a utility power alternating voltage, the first induction coil providing a first utility alternating power to the first DC power circuit, and the second induction coil providing a second utility alternating power to the second DC power circuit,
wherein the first grounding end is not directly electrically connected to the second grounding end, the first grounding end and the second grounding end are each electrically connected to a compliance ground of the utility power alternating voltage through a jumper-wire zero-ohm resistor.

10. The vacuum tube amplification system of claim 9, wherein the first DC power circuit and the second DC power circuit are electrically connected to the first grounding end and the second grounding end, respectively.

11. The vacuum tube amplification system of claim 9, wherein the first DC voltage comprises a DC high voltage and a DC low voltage, and the first vacuum tube amplification load circuit comprises a plurality of vacuum tubes, wherein the DC high voltage and the DC low voltage are supplied to the vacuum tubes for operation thereof.

12. The vacuum tube amplification system of claim 9, wherein the second DC voltage comprises a DC high voltage and a DC low voltage, and the second vacuum tube amplification load circuit comprises a plurality of vacuum tubes, wherein the DC high voltage and the DC low voltage are supplied to the vacuum tubes for operation thereof.

13. The vacuum tube amplification system of claim 9, wherein the first induction coil and the second induction coil have the same winding configuration.

14. The vacuum tube amplification system of claim 9, wherein the first induction coil has a first high voltage winding and a first low voltage winding, whereas the second induction coil has a second high voltage winding and a second low voltage winding, wherein the first high voltage winding and the second high voltage winding have the same winding configuration, wherein the first low voltage winding and the second low voltage winding have the same winding configuration.

15. A grounding method for a vacuum tube amplification system, the vacuum tube amplification system comprising a first DC power circuit, a first vacuum tube amplification load circuit, a second DC power circuit and a second vacuum tube amplification load circuit, wherein the first DC power circuit supplies power to the first vacuum tube amplification load circuit for operation thereof, and the second DC power circuit supplies power to the second vacuum tube amplification load circuit for operation thereof, the grounding method comprises the steps of:

receiving a utility power alternating voltage by a first exciting coil of a power transformer;

electrically connecting a first induction coil and a second induction coil of the power transformer to the first DC power circuit and the second DC power circuit, respectively;

electrically connecting the first DC power circuit and the first vacuum tube amplification load circuit to a first grounding end from inside to outside step by step;

electrically connecting the second DC power circuit and the second vacuum tube amplification load circuit to a second grounding end from inside to outside step by step; and electrically connecting the first grounding end and the second grounding end separately to a compliance ground of the utility power alternating voltage through a jumper-wire zero-ohm resistor, without electrically connecting the first grounding end directly to the second grounding end.

16. The grounding method of claim 15, wherein the first induction coil and the second induction coil have the same winding configuration.

* * * * *